United States Patent
Bai

(10) Patent No.: US 10,787,729 B2
(45) Date of Patent: Sep. 29, 2020

(54) MASK PLATE AND METHOD FOR MANUFACTURING THE SAME

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Shanshan Bai, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/576,524

(22) PCT Filed: May 10, 2017

(86) PCT No.: PCT/CN2017/083739
§ 371 (c)(1),
(2) Date: Nov. 22, 2017

(87) PCT Pub. No.: WO2018/000949
PCT Pub. Date: Jan. 4, 2018

(65) Prior Publication Data
US 2019/0003033 A1 Jan. 3, 2019

(30) Foreign Application Priority Data

Jun. 29, 2016 (CN) .................... 2016 2 0661367 U

(51) Int. Cl.
*C23C 14/04* (2006.01)
*C23C 14/24* (2006.01)
(Continued)

(52) U.S. Cl.
CPC .......... *C23C 14/042* (2013.01); *B05C 21/005* (2013.01); *C23C 14/24* (2013.01); *H01L 51/0011* (2013.01)

(58) Field of Classification Search
None
See application file for complete search history.

(56) References Cited

U.S. PATENT DOCUMENTS

| | | | |
|---|---|---|---|
| 6,475,287 B1 * | 11/2002 | Clark | C23C 14/042 118/504 |
| 2004/0202821 A1 * | 10/2004 | Kim | B32B 3/266 428/137 |
| 2011/0067630 A1 * | 3/2011 | Ko | C23C 14/042 118/721 |

FOREIGN PATENT DOCUMENTS

| | | |
|---|---|---|
| CN | 1534383 A | 10/2004 |
| CN | 1776525 A | 5/2006 |

(Continued)

OTHER PUBLICATIONS

International search report dated Jul. 27, 2017 for corresponding international application PCT/CN2017/083739 with English translation attached.

*Primary Examiner* — Jethro M. Pence
(74) *Attorney, Agent, or Firm* — Nath, Goldberg & Meyer; Joshua B. Goldberg

(57) ABSTRACT

A mask plate and a method for manufacturing the same are provided. The mask plate comprises a first sub-mask plate and a second sub-mask plate stacked with each other, the first sub-mask plate is provided with at least one first opening therein, a size and a shape of the first opening correspond to those of a target display panel; the second sub-mask plate is provided with a second opening region, which covers at least one of the at least one first opening and includes a plurality of second openings. Since it is only (Continued)

required to ensure that the sizes and shapes of the first openings are the same as those of the target display panels respectively, and it is unnecessary to further manufacture openings for forming pixel patterns, comparing with the existing mask plate, the manufacturing process of the present disclosure is more simple and the manufacturing cost is lower.

19 Claims, 3 Drawing Sheets

(51) Int. Cl.
  *B05C 21/00* (2006.01)
  *H01L 51/00* (2006.01)

(56) References Cited

FOREIGN PATENT DOCUMENTS

| | | |
|---|---|---|
| CN | 101864552 A | 10/2010 |
| CN | 102023474 A | 4/2011 |
| CN | 205688000 U | 11/2016 |
| KR | 20150106504 A | 9/2015 |

* cited by examiner

MASK PLATE AND METHOD FOR MANUFACTURING THE SAME

CROSS-REFERENCE TO RELATED APPLICATION

The present application claims priority to Chinese Patent Application No. 201620661367.2 filed on Jun. 29, 2016, entitled "MASK PLATE", the disclosure of which is hereby incorporated by reference in its entirety.

TECHNICAL FIELD

The present application relates to a field of vacuum evaporation technology for OLED, and particularly relates to a mask plate and a method for manufacturing the same.

BACKGROUND ART

In Organic Light-Emitting Diode (OLED) technology, a vacuum evaporation process is an important process for manufacturing an OLED, and a mask plate is a key member in the vacuum evaporation process. A new type of mask plate is needed to manufacture display panels.

SUMMARY

An object of the present application is to provide a mask plate, which can reduce the manufacturing cost.

In an aspect, there is provided a mask plate comprising a first sub-mask plate and a second sub-mask plate stacked with each other, wherein the first sub-mask plate is provided with at least one first opening provide therein, and a size and a shape of the first opening correspond to those of a target display panel; the second sub-mask plate is provided with a second opening region, which covers at least one of the at least one first opening and includes a plurality of second openings.

Optionally, the shape of the first opening is the same as that of the target display panel, and an area of the first opening is larger than that of the target display panel.

Optionally, a distance from an edge of an orthographic projection of the first opening on a backboard glass to a closest edge of the target display panel on the backboard glass corresponding to the first opening ranges from 75 μm to 150 μm.

Optionally, a shape of the second opening region is a rectangle.

Optionally, the second sub-mask plate is provided with a plurality of second opening regions, and shapes of the second opening regions are the same with each other.

Optionally, sizes of the second opening regions are the same with each other.

Optionally, the second sub-mask plate is stacked on the first sub-mask plate.

Optionally, outline dimensions of the first sub-mask plate and the second sub-mask plate are the same with each other, and shapes of the first sub-mask plate and the second sub-mask plate are the same with each other.

Optionally, the second sub-mask plate includes a plurality of parts with the same shapes and the same sizes, and the plurality of parts are spliced together to form the second sub-mask plate.

Furthermore, the mask plate further comprises a frame, wherein the first sub-mask plate is welded to the frame through first weld spots, the parts forming the second sub-mask plate are welded to the first sub-mask plate through second weld spots.

Optionally, a distance between the first weld spot and the second weld spot closest thereto is larger than 2 mm.

Optionally, the first weld spots are arranged at positions on a periphery of the first sub-mask plate, the second weld spots are arranged at first sides and second sides of the parts forming the second sub-mask plate, and wherein the first sides and the second sides are sides of the parts of the second sub-mask plate, which are not used for splicing.

Optionally, the first sub-mask plate and the second sub-mask plate comprise metal-invar alloy material.

Optionally, a thickness of the first sub-mask plate ranges from 100 μm to 150 μm, and a thickness of the second sub-mask plate ranges from 20 μm to 40 μm.

In another aspect, there is provided a method for manufacturing mask plate comprising steps of:

forming a first sub-mask plate, wherein the first sub-mask plate is provided with at least one first opening therein, and a size and a shape of the first opening correspond to those of a target display panel;

forming a second sub-mask plate, wherein the second sub-mask plate is provided with a second opening region therein, the second opening region covers at least one of the at least one first opening and includes a plurality of second openings;

bonding the first sub-mask plate to a frame; and bonding the second sub-mask plate to the first sub-mask plate.

Optionally, bonding the first sub-mask plate to the frame further comprises: welding the first sub-mask plate to the frame, and bonding the second sub-mask plate to the first sub-mask plate comprises: aligning the second sub-mask plate to the first sub-mask plate; and welding the second sub-mask plate to the first sub-mask plate.

Optionally, aligning the second sub-mask plate to the first sub-mask plate further comprises: aligning first alignment holes at edges and corners of the first opening in the first sub-mask plate to second alignment holes in the second opening region of the second sub-mask plate.

Optionally, forming the second sub-mask plate further comprises: splicing a plurality of parts with same sizes and same shapes together to form the second sub-mask plate.

REFERENCE NUMERALS

1—first sub-mask plate; 2—second sub-mask plate; 3—backboard glass; 4—frame; 11—first opening;

12—shielding region; 13—first weld spot; 21—second opening region; 22—strip part; 23—second weld spot; 31—display panel; 211—second opening; 231—first side; 232—second side.

DETAILED DESCRIPTION OF THE EMBODIMENTS

In order to make a person skilled in the art better understand solutions of the present application, the present application will be described in detail below in conjunction with the accompanying drawings and implementations.

The traditional mask plate has a plurality of openings arranged in a matrix manner for forming pixel patterns on display panels located on a backboard glass by using evaporation materials. The plurality of openings form a plurality of opening regions, shapes and sizes of the opening regions are the same as those of the display panels on the backboard glass, and the opening regions are distributed in a same manner as that of the display panels on the backboard glass. As rapid development of the display industry and the diversity of people's requirements, the shape of the display panel in the field of wearable devices is not limited to the traditional rectangle, but can be circular or irregular shape with a sense of design.

However, the existing mask plate is of a single-layered structure, opening regions in the mask plate correspond to shapes and sizes of the target display panels, therefore, in a case of manufacturing display panels with different shapes and sizes, it is required to use various mask plates. Accordingly, it is necessary to manufacture mask plates with various shapes and sizes. Since a process for manufacturing openings in the mask plate for forming the pixel patterns is complicated, and it requires a high manufacturing accuracy, thus resulting in a high manufacturing cost of the mask plate.

Therefore, there is provided a new type of mask plate in the disclosure.

Figure 1A:
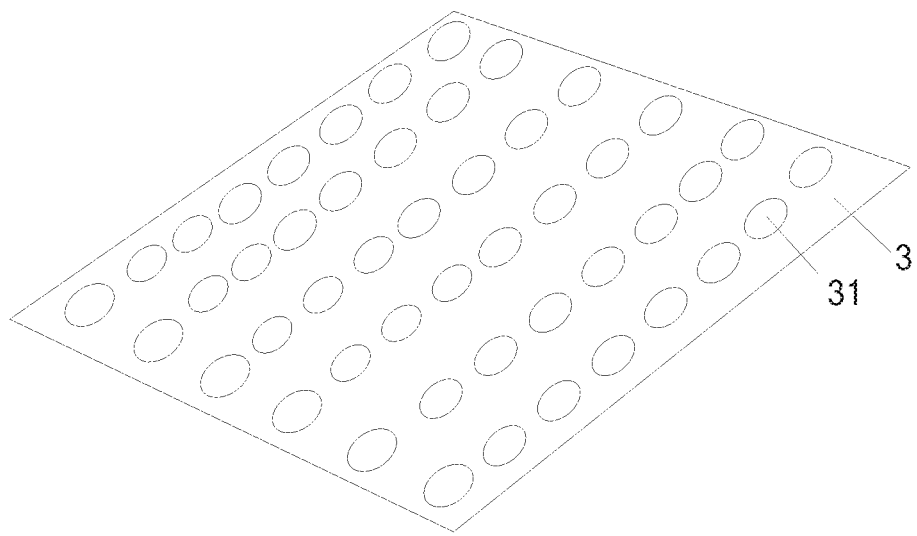
FIG. 1a is a structural diagram of a backboard glass in an embodiment of the present application.

As shown in FIG. 1a, a backboard glass 3 includes a plurality of target display panels 31, and the present embodiment is explained by taking a display panel 31 with a circle shape as an example. It should be noted that the backboard glass 3 may include only one target display panel 31.

Figure 1B:
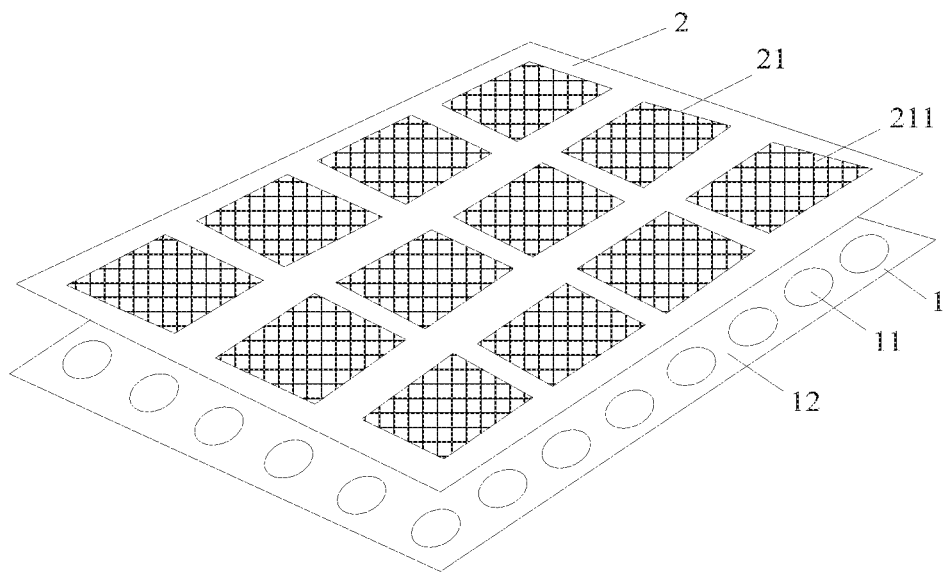
FIG. 1b is a structural diagram of a mask plate in an embodiment of the present application.

As shown in FIG. 1b, the present application provides a mask plate comprising a first sub-mask plate 1 and a second sub-mask plate 2 stacked with the first sub-mask plate 1, wherein the first sub-mask plate 1 is provided with at least one first opening 11 therein, and a region of the first sub-mask plate 1 other than the first opening 11 is a shielding region 12. A size and a shape of the first opening 11 are respectively the same as those of the target display panel 31 on the backboard glass 3, that is, the first opening 11 corresponds to the target display panel 31. The second sub-mask plate 2 is provided with at least one second opening region 21 therein, and the second opening region 21 covers at least one of the at least one first opening 11. The second opening region 21 includes a plurality of second openings 211, which are provided in a matrix manner and correspond to pixels so that they are used for forming pixel patterns.

The mask plate in the present embodiment is of a two-layered structure, and comprises the first sub-mask plate 1 and the second sub-mask plate 2 which are stacked with each other, the first sub-mask plate 1 is provided with at least one first opening 11, the size and the shape of which are respectively the same as those of the target display panel 31. The second sub-mask plate 2 is provided with the second opening region 21 therein, a plurality of second openings 211 for forming pixel patterns are provided in a matrix manner in the second opening region 21, and the second opening region 21 covers at least one of the at least one first opening 11. In a case of manufacturing target display panels 31 with different shapes and sizes are to be manufactured, it is only required to configure the first openings 11 in the first sub-mask plate 1 so that the first openings 11 have the same sizes and shapes as the target display panels 31 respectively, and by assembling the first sub-mask plate 1 with the existing second sub-mask plate 2, a new mask plate is formed. Since it is only required to ensure that the sizes and shapes of the first openings 11 are the same as those of the target display panels 31 respectively, and it is unnecessary to further manufacture openings for forming pixel patterns, therefore, comparing with the existing mask plate, the manufacturing process of the mask plate according to the present disclosure is more simple and the manufacturing cost is lower.

In a practical application, as shown in FIG. 1b, an area of the first opening 11 may be slightly larger than that of the target display panel 31. In this case, in a process of tension and stretch of the mask plate, even the size and shape of the first opening 11 change, the problem that evaporation material cannot be evaporated on the target display panel 31 will not occur.

Figure 2:
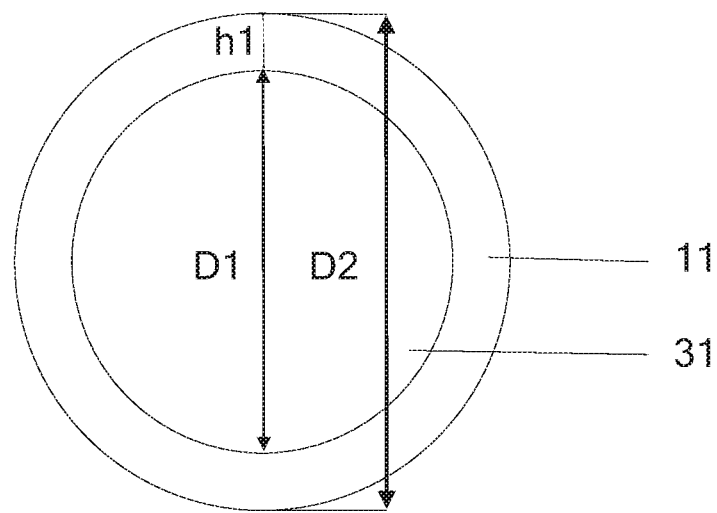
FIG. 2 shows a projection relationship between a first opening and a display panel according to an embodiment of the present application.

Optionally, a distance between an edge of an orthographic projection of the first opening 11 on the backboard glass 3 and a closest edge of a corresponding target display panel 31 on the backboard glass 3 ranges from 75 μm to 150 μm. The present embodiment will be explained by taking the display panel 31 and the first opening 11 are of circle shapes as an example. As shown in FIG. 2, a distance h1 between the edge of the orthographic projection of the first opening 11 on the backboard glass 3 and the closest edge of the corresponding target display panel 31 on the backboard glass 3 ranges from 75 μm to 150 μm, that is, a diameter D2 of the first opening 11 is larger than a diameter D1 of the target display panel 31 by 150-300 μm.

The second opening region 21 may be of a circle shape, a rectangle shape, a polygon shape and so on. Optionally, the second opening region 21 may be of a rectangle shape, thus in the process of tension and stretch of the mask plate, comparing with the second opening region 21 of non-rectangle shape, the second opening region 21 of rectangle shape may have uniform stress strain, therefore, wrinkles can be prevented from occurring in the second mask plate 2, avoiding the defect of color mixing of the display panel after the evaporation process.

As shown in FIG. 1b, in a case that the first sub-mask plate 1 is provided with a plurality of first openings 11 therein, and the second sub-mask plate 2 is provided with a plurality of second opening regions 21 therein, shapes of the second opening regions 21 in the second sub-mask plate 2 may be not limited to the shapes, arrangement, distribution of the display panels 31 and the circuits at the frame. As long as the second opening regions 21 have the same shapes, in the process of tension and stretch of the mask plate, the second opening regions 21 may have uniform stress strain, thus no winkle will occur in the second sub-mask plate 2. Accordingly, the second openings 211 in the second opening regions 21 may generate the same deformation, thus pixel patterns formed through the second openings 211 have the same sizes and shapes, therefore, the problem of defect of color mixing of the display panel after the evaporation process can be solved.

Optionally, sizes of the second opening regions 21 are the same with each other, thus in the process of tension and stretch of the mask plate, the second opening regions 21 with the same shapes and sizes may have more uniform stress strain.

As shown in FIG. 1b, the second sub-mask plate 2 is stacked on the first sub-mask plate 1, the evaporation process is performed in an order from the second sub-mask plate 2 to the first sub-mask plate 1. A gap exists between the first sub-mask plate 1 and the second sub-mask plate 2 and the evaporation material may be diffused between the first sub-mask plate 1 and the second sub-mask plate 2. The evaporation material first passes through the second openings 211 in the second opening regions 21 of the second sub-mask plate 2 and diffuses, and then passes through the first openings 11 in the first sub-mask plate 1 and is evaporated onto the display panels 31. Since the first sub-mask plate 1 is under the second sub-mask plate 2, the shielding region 12 of the first sub-mask plate 1 may block the evaporation material, therefore, the evaporation material cannot be evaporated onto a region other than the display panels 31.

Optionally, the first sub-mask plate 1 and the second sub-mask plate 2 may have the same outline dimensions and shapes.

The second opening region 21 may cover one or more first openings 11, for example, the second opening region 21 may cover two first openings 11 or four first openings 11. In the present embodiment, as shown in FIG. 1b, the second opening region 21 covers four first openings 11.

Figure 3:
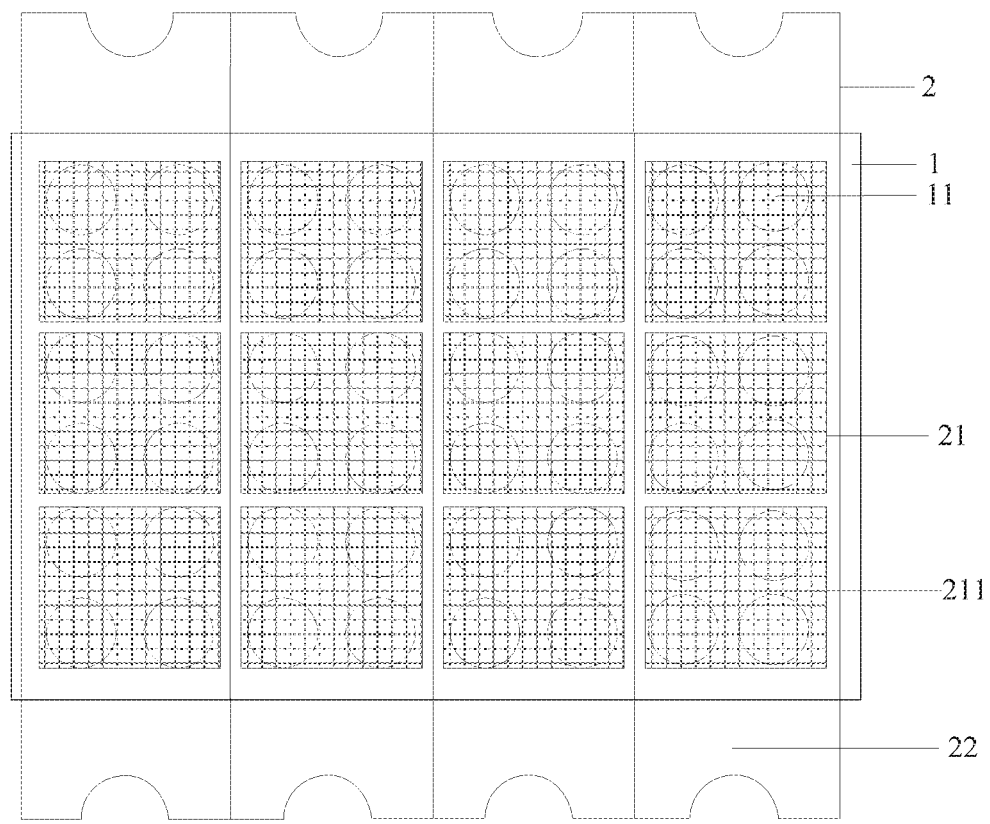
FIG. 3 is a structural diagram of a mask plate in an embodiment of the present application.

As shown in FIG. 3, the first sub-mask plate 1 is of an integration structure, and the second sub-mask plate 2 may include a plurality of parts with the same shapes and sizes, which are spliced together to form the second sub-mask plate 2. In the embodiment, the parts forming the second sub-mask plate 2 are of strip shapes, a size and a shape of the second sub-mask plate 2 formed by splicing the strip parts 22 may be the same as the outline dimension and shape of the backboard glass. The present embodiment will be described by taking the second sub-mask plate 2 including four strip parts 22 as an example. In the process of tension and stretch of the mask plate, the strip parts 22 may uniformly bear the stress applied to the second sub-mask plate 2, so that the stress strains of the strip parts 22 are more uniform, further ensuring that the defect of color mixing of the display after the evaporation process will not occur.

It should be noted that first alignment holes (not shown in drawings) are provided at edges and corners of the first openings 11 in the first sub-mask plate 1, and second alignment holes (not shown in drawings) are provided at positions in the second opening regions 21 of the second sub-mask plate 2 corresponding to the edges and corners of the first openings 11, by aligning the first alignment holes and the second alignment holes, the first sub-mask plate 1 and the second sub-mask plate 2 may be accurately aligned.

Figure 4:
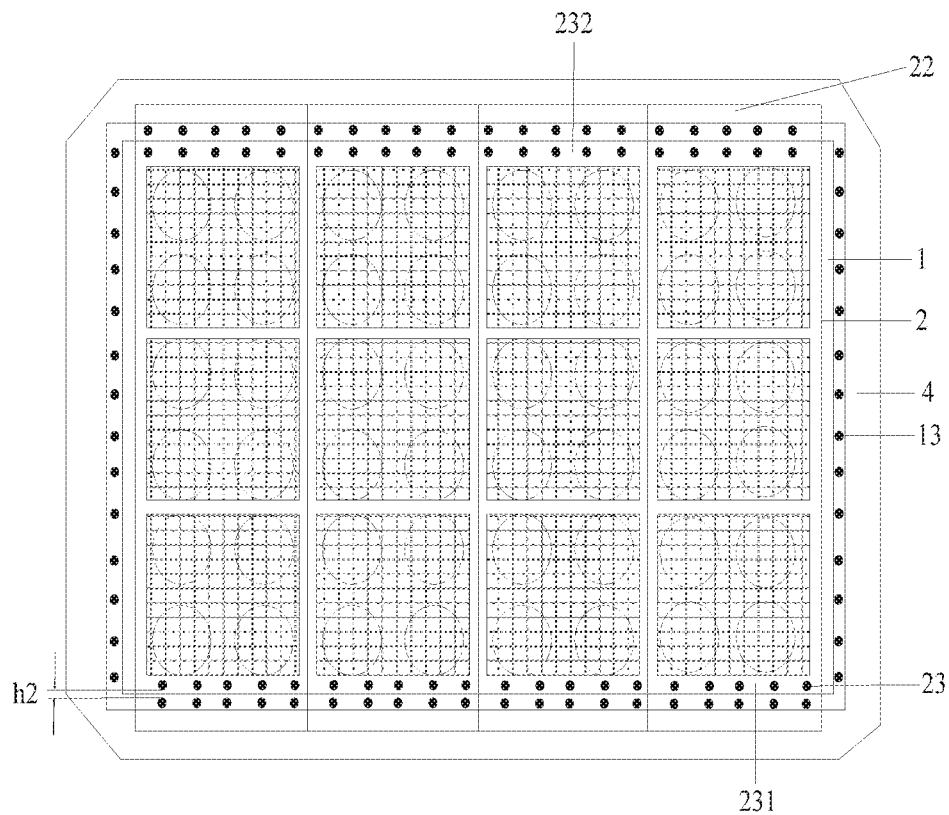
FIG. 4 is a structural diagram of a mask plate in an embodiment of the present application.

As shown in FIG. 4, the mask plate in the embodiment may further comprise a frame 4, the first sub-mask plate 1 is welded to the frame through first weld spots 13, the strip parts 22 forming the second sub-mask plate 2 are welded to the first sub-mask plate 1 through second weld spots 23. As such, even in a case that the first sub-mask plate 1 is welded to the frame 4 by error, during a new weld for repairing, it is unnecessary to repair the weld positions of the strip parts 22, thus remarkably increasing the repairing efficiency.

Optionally, as shown in FIG. 4, a distance h2 between the first weld spot 13 and the second weld spot 23 closest thereto is larger than 2 mm, which can facilitate welding and avoid errors in welding positions.

The first weld spots 13 are arranged at positions on a periphery of the first sub-mask plate 1, the second weld spots 23 are arranged at first sides 231 and second sides 232 of the parts forming the second sub-mask plate 2. The first side 231 and the second side 232 are sides of the part 22 of the second sub-mask plate 2 not being adjacent to each other.

Optionally, the first sub-mask plate 1 and the second sub-mask plate 2 may comprise metal-invar alloy material.

Optionally, a thickness of the first sub-mask plate 1 ranges from 100 µm to 150 µm, and a thickness of the second sub-mask plate 2 ranges from 20 µm to 40 µm.

Figure 5:
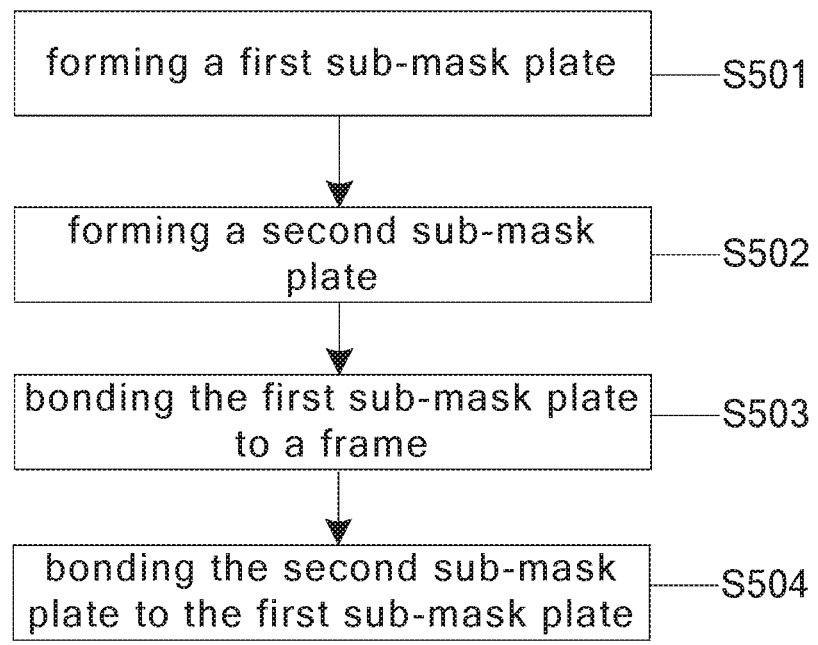
FIG. 5 is a flow chart of a method for manufacturing a mask plate according to an embodiment of the present application.

FIG. 5 is a flow chart of a method for manufacturing a mask plate according to an embodiment of the present application. As shown in FIG. 5, the method for manufacturing the above mentioned mask plate comprises:

Step S501, forming a first sub-mask plate, wherein the first sub-mask plate is provided with at least one first openings therein, and a size and a shape of the first opening correspond to those of a target display panel;

Step S502, forming a second sub-mask plate, wherein the second sub-mask plate is provided with a second opening region therein, the second opening region covers at least one of the at least one first opening and includes a plurality of second openings;

Step S503, bonding the first sub-mask plate to a frame; and

Step S504, bonding the second sub-mask plate to the first sub-mask plate.

The step S503 further comprises: welding the first sub-mask plate to the frame.

The step S504 further comprises: aligning the second sub-mask plate to the first sub-mask plate; and welding the second sub-mask plate to the first sub-mask plate.

Optionally, the step S504 further comprises: aligning first alignment holes at edges and corners of the first openings in the first sub-mask plate to second alignment holes within the second opening regions of the second sub-mask plate.

Optionally, the step S502 further comprises: splicing a plurality of parts with same sizes and same shapes together to form the second sub-mask plate.

Hereinafter, a method for assembling the first sub-mask plate and the second sub-mask plate in the method for manufacturing the above mask plate will be described below in conjunction with FIG. 4.

First, a stretching machine (not shown in drawings) is used to stretch the first sub-mask plate 1, after a position of the first sub-mask plate 1 is fixed through the first alignment holes, the first sub-mask plate 1 is welded to the frame 4 through the first weld spots 13, wherein a droop amount of the first sub-mask plate 1 is less than 150 µm. Then the strip parts 22 forming the second sub-mask plate 2 are stretched, after positions of the strip parts 22 are fixed through the second alignment holes, the strip parts 22 forming the second sub-mask plate 2 are welded to the first sub-mask plate 1 through the second weld spots 23, thus assembling of the whole mask plate is completed.

Manufacturing a display panel of circle shape has a high demand on the mask plate, the mask plate in the embodiment corresponds to the backboard glass completely, and the first sub-mask plate is used in cooperation with the second sub-mask plate, so that limitation of the periphery circuit of the display panel and the evaporation process to the design of the mask plate can be reduced, therefore the mask plate may be manufactured according to an optimal design. The mask plate in the embodiment can not only be used to manufacture a display panel of non-traditional rectangular shape such as a circular shape, but also reduce the defects caused by the mask plate so as to improve the yield of the products.

The above embodiment may have following advantages.

The mask plate in the above embodiment is of a two-layered structure, and comprises a first sub-mask plate and a second sub-mask plate which are stacked with each other, the first sub-mask plate is provided with at least one first opening, a size and shape of which are the same as those of the a target display panel. The second sub-mask plate is provided at least one second opening region therein, a plurality of second openings for forming pixel patterns are provided in a matrix manner in the second opening region, and the second opening region covers at least one of the at least one first opening. In a case of manufacturing target display panels with different shapes and sizes, it is only required to configure the first openings of the first sub-mask plate to respectively have the same sizes and same shapes as the target display panels respectively, and by assembling the first sub-mask plate with the existing second sub-mask plate, a new mask plate is formed. Since during manufacturing the mask plate, it is only required to ensure that the sizes and shapes of the first openings are respectively the same as those of the target display panels respectively, and it is unnecessary to further manufacture openings for forming pixel patterns, therefore, comparing with the existing mask plate, the manufacturing process according to the present disclosure is more simple and the manufacturing cost is lower.

It should be understood that, the foregoing embodiments are only exemplary embodiments used for explaining the principle of the present invention, but the present invention is not limited thereto. Various variations and improvements may be made by a person skilled in the art without departing from the protection scope of the present invention, and these variations and improvements also fall into the protection scope of the present invention.

The invention claimed is:

1. A mask plate comprising a first sub-mask plate and a second sub-mask plate stacked with each other, wherein
   the first sub-mask plate is provided with a plurality of first openings therein, a size and a shape of each of the plurality of first openings are the same as those of a target display panel;
   the second sub-mask plate is provided with a plurality of second opening regions, each of which covers a plurality of first openings and comprises a plurality of second openings, and
   the second sub-mask plate comprises a plurality of parts each with a same strip shape and a same size, the plurality of parts are separate and spliced together to form the second sub-mask plate, each of the plurality of parts comprises at least one of the plurality of second opening regions; and
   each of the plurality of parts is bonded to the first sub-mask at two opposite sides thereof.

2. The mask plate of claim 1, wherein the shape of the first opening is the same as that of the target display panel, and an area of the first opening is larger than that of the target display panel.

3. The mask plate of claim 2, wherein a distance from an edge of an orthographic projection of the first opening on a backboard glass to a closest edge of the target display panel on the backboard glass corresponding to the first opening ranges from 75 μm to 150 μm.

4. The mask plate of claim 1, wherein the shape of each of the plurality of first openings is circular and a shape of each of the plurality of second opening regions is a rectangle.

5. The mask plate of claim 1, wherein the second sub-mask plate is provided with a plurality of second opening regions, and shapes of the second opening regions are the same with each other.

6. The mask plate of claim 5, wherein sizes of the second opening regions are the same with each other.

7. The mask plate of claim 1, wherein the second sub-mask plate is stacked on the first sub-mask plate.

8. The mask plate of claim 1, wherein outline dimensions of the first sub-mask plate and the second sub-mask plate are the same with each other, and shapes of the first sub-mask plate and the second sub-mask plate are the same with each other.

9. The mask plate of claim 1, further comprising a frame, wherein the first sub-mask plate is welded to the frame through first weld spots, the parts forming the second sub-mask plate are welded to the first sub-mask plate through second weld spots.

10. The mask plate of claim 9, wherein the first weld spots are arranged at positions on a periphery of the first sub-mask plate, the second weld spots are arranged at first sides and second sides of the parts forming the second sub-mask plate, and wherein the first sides and the second sides are sides of the parts of the second sub-mask plate, which are not used for splicing.

11. The mask plate of claim 10, wherein a distance between the first weld spot and the second weld spot closest to the first weld spot is larger than 2 mm.

12. The mask plate of claim 1, wherein the first sub-mask plate and the second sub-mask plate comprise metal-invar alloy material.

13. The mask plate of claim 2, wherein the first sub-mask plate and the second sub-mask plate comprise metal-invar alloy material.

14. The mask plate of claim 1, wherein a thickness of the first sub-mask plate ranges from 100 μm to 150 μm, and a thickness of the second sub-mask plate ranges from 20 μm to 40 μm.

15. A method for manufacturing mask plate, comprising:
   forming a first sub-mask plate, wherein the first sub-mask plate is provided with a plurality of first openings therein, a size and a shape of each of the plurality of first openings are the same as those of a target display panel;
   forming a second sub-mask plate, wherein the second sub-mask plate is provided with a plurality of second opening regions, each of which covers a plurality of first opening and comprises a plurality of second openings;
   bonding the first sub-mask plate to a frame; and
   bonding the second sub-mask plate to the first sub-mask plate, wherein
   the second sub-mask plate comprises a plurality of parts each with a same strip shape and a same size, the plurality of parts are separate and spliced together to form the second sub-mask plate, each of the plurality of parts comprises at least one of the plurality of second opening regions; and
   each of the plurality of parts is bonded to the first sub-mask at two opposite sides thereof.

16. The method of claim 15, wherein bonding the first sub-mask plate to the frame further comprises:
   bonding the first sub-mask plate to the frame, and bonding the second sub-mask plate to the first sub-mask plate comprises:
aligning the second sub-mask plate to the first sub-mask plate; and
welding the second sub-mask plate to the first sub-mask plate.

17. The method of claim 16, wherein aligning the second sub-mask plate to the first sub-mask plate further comprises:
aligning first alignment holes at edges and corners of the first opening in the first sub-mask plate to second alignment holes in the second opening region of the second sub-mask plate.

18. The method of claim 15, wherein forming the second sub-mask plate further comprises:
splicing a plurality of parts with same sizes and same shapes together to form the second sub-mask plate.

19. The method of claim 15, wherein the shape of the first opening is circular and the shape of the second opening region is a rectangle.

* * * * *